(12) United States Patent
West et al.

(10) Patent No.: US 6,841,455 B2
(45) Date of Patent: Jan. 11, 2005

(54) SCRIBE STREET SEALS IN SEMICONDUCTOR DEVICES AND METHOD OF FABRICATION

(75) Inventors: Jeffrey A. West, San Antonio, TX (US); Paul M. Gillespie, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/319,663

(22) Filed: Dec. 13, 2002

(65) Prior Publication Data

US 2003/0122220 A1 Jul. 3, 2003

Related U.S. Application Data

(62) Division of application No. 09/570,230, filed on May 12, 2000, now Pat. No. 6,521,975.
(60) Provisional application No. 60/135,138, filed on May 20, 1999.

(51) Int. Cl.[7] .............................................. H01L 21/46
(52) U.S. Cl. ...................... 438/462; 438/113; 438/637; 438/458; 257/620; 257/508
(58) Field of Search ................................ 438/462, 401, 438/637, 113, 458; 257/620, 508, 618, 619, 797, 644

(56) References Cited

U.S. PATENT DOCUMENTS

| | | | |
|---|---|---|---|
| 5,530,280 A | | 6/1996 | White |
| 5,665,655 A | * | 9/1997 | White .......................... 438/584 |
| 5,763,936 A | | 6/1998 | Yamaha et al. |
| 5,831,330 A | | 11/1998 | Chang |
| 5,880,528 A | | 3/1999 | Seshan et al. |
| 5,891,808 A | * | 4/1999 | Chang et al. ............... 438/740 |
| 5,977,639 A | | 11/1999 | Seshan et al. |
| 6,043,551 A | | 3/2000 | Seshan |
| 6,300,223 B1 | * | 10/2001 | Chang et al. ............... 438/460 |

* cited by examiner

*Primary Examiner*—David Nelms
*Assistant Examiner*—Andy Huynh
(74) *Attorney, Agent, or Firm*—W. Daniel Swayze, Jr.; W. James Brady; Frederick J. Telecky, Jr.

(57) ABSTRACT

An integrated circuit wafer, covered by a protective overcoat, comprising an array of integrated circuit chips bordered by seal regions and separated by dicing lines; at least two sets of substantially parallel structures within each of said seal regions, each set extending along the edge of a chip on opposite sides of each said dicing line, respectively; each of said sets comprising at least one continuous barrier wall adjacent each chip, respectively; at least one sacrificial composite structure in combination therewith, between said wall and the center of said dicing line, said composite structure being a discontinuous barrier wall comprising metal rivets interconnecting electrically conductive layers in an alternating manner, whereby said composite structure provides mechanical strength to said sets and simultaneously disperses the energy associated with crack propagation; and at least one slot opened into said protective overcoat, reaching from the surface of said overcoat at least to the surface-nearest electrically conductive layer of said composite structure, whereby cracks propagating in said protective overcoat will be stopped.

16 Claims, 3 Drawing Sheets

SCRIBE STREET SEALS IN SEMICONDUCTOR DEVICES AND METHOD OF FABRICATION

This is a divisional application of Ser. No. 09/570,230, filed May 12, 2000, now U.S. Pat. No. 6,521,975, which is a non-provisional application claiming priority from provisional application Ser. No. 60/135,138, filed May 20, 1999.

FIELD OF THE INVENTION

The present invention is related in general to the field of semiconductor devices and processes and more specifically to the fabrication of integrated circuit chips protected against potential damage caused by the propagation of cracks initiated by the step of separating semiconductor wafers into individual chips.

DESCRIPTION OF THE RELATED ART

With most semiconductor products, for example integrated circuits, transistors and diodes, a large number of elements are manufactured simultaneously on a large semiconductor wafer of silicon, silicon germanium, gallium arsenide, etc. The semiconductor industry employs the terms "dicing technologies" or "scribing technologies" to refer to those techniques for obtaining a large number of functional chips, or dies, from each semiconductor wafer. Two dicing methods are particularly well known in the art: The grinding-cutting method, using a blade or wire saw, and the scribing method, using a diamond point. Modern silicon technology prefers the cutting method using high-speed rotating blades. When laying out the pattern of integrated circuit (IC) chips on the surface of the semiconductor wafer, manufacturing efficiency requires to minimize the distance between adjacent IC chips so that the number of obtainable chips (the production yield) can be maximized.

The technology of dicing has been developed to a high standard. In U.S. Pat. No. 4,610,079 of Sep. 9, 1986 (Abe et al., "Method of Dicing a Semiconductor Wafer"), it has been pointed out that three restrictions exist with respect to the minimum distance permissible between adjacent chips. The first restriction is the actual dicing width, the second restriction is the degree of precision to which the cutting machine can be adjusted, and the third restriction is the cracks and chip-outs extending laterally from the dicing line into the semiconductor and insulating materials. Even today, the third of these restrictions, namely the generation of cracks, creates significant limitations with respect to minimizing the distance between adjacent IC chips. In addition, those cracks represent significant reliability risks, since they tend to grow and widen under thermal and mechanical stress and thus eventually imperil the functionality of the IC.

Several solutions have been proposed to solve some of these technical problems associated with the manufacture and dicing of semiconductor wafers. The sealing of dicing streets against penetration of mobile ions with the help of metal edge barriers overlapping insulating layers was proposed in U.S. Pat. No. 4,364,078 of December 1982 (Smith et al., "Edge Barrier of Polysilicon and Metal for Integrated Circuit Chips") and U.S. Pat. No. 4,656,055 of April 1987 (Dwyer, "Double Level Metal Edge Seal for a Semiconductor Device"). These structures proved ineffective against cracks when insulators extend into the dicing lines and are subject to cracks during the dicing process. In U.S. Pat. No. 5,024,970 of July 1991 (Mori, "Method of Obtaining Semiconductor Chips"), small grooves are obtained in the insulating zone by plasma etching. Many cracks originating from the dicing process are seen to stop at these grooves, but not all of them.

Forming consecutive grooves of different widths by using diamond and resin blades has been described in U.S. Pat. No. 5,266,528 of November 1993 (Yamada et al., "Method of Dicing Semiconductor Wafer with Diamond and Resin Blades"). Dicing line features to limit the spreading of cracks and chip-outs generated during dicing have been proposed in U.S. Pat. No. 4,610,079 of September 1986, mentioned above. Avoiding residues of layers of non-uniform thicknesses, or the generation of lose particles, has been described in U.S. Pat. No. 5,136,354 of August 1992 (Morita et al., "Semiconductor Device Wafer with Interlayer Insulating Film Covering the Scribe Lines") with added division in U.S. Pat. No. 5,237,199 of August 1993. In these patents, the etching of slit grooves in passivation films is described in order to stop cracks in the passivation layers during the dicing process.

The latter ideas were continued and elaborated in U.S. Pat. No. 5,414,297 of May 1995 (Morita et al., "Semiconductor Device Chip with Interlayer Insulating Film Covering the Scribe Lines"). In particular, it is described how the processes used in forming the conductive interconnections between elements of the integrated circuit can be exploited to generate one vertical metal line parallel to the dicing lines so that it extends around the entire periphery of each integrated circuit chip.

Practical semiconductor manufacturing has demonstrated, however, that these structures do not stop severe cracks originating in the dicing process. On the contrary, thermomechanical stresses generated by modern device applications, board attach processes, or rigorous environmental testing procedures may convey enough energy to many cracks so that they will eventually bypass obstacles or break through a single seal. Following these cracks, moisture and contamination are free to penetrate active circuitry and to start degrading the electrical device performance drastically.

In U.S. patent application Ser. No. 60/073,939, filed on Feb. 6, 1998 (Ibnabdeljalil et al, "Sacrificial Structures for Arresting Insulator Cracks in Semiconductor Devices"), scribe street seals are described having at least two sets of substantially parallel structures, each set extending along the edge of a chip on opposite sides of each dicing line. Each set comprises at least one continuous barrier wall and a sacrificial composite structure having means of dispersing the energy associated with crack propagation. This concept, however, does not prevent the lateral propagation of surface-near cracks or the risk of widespread delamination of structures especially when copper instead of aluminum is employed as interconnecting metal.

In summary, the goal of providing a technology for dicing semiconductor wafers with assured protection against mechanical and environmental damages and thus offering for the commercial and military markets cost-effective and reliable semiconductor products, manufactured in high volume and with flexible, low-cost design and production methods, has remained elusive, until now. The new design and method of fabrication should be flexible enough to be applied for different semiconductor product families and a wide spectrum of process variations. Preferably, these innovations should be accomplished using the installed equipment base so that no investment in new manufacturing machines is needed.

SUMMARY OF THE INVENTION

The invention describes sets of seal structures in semiconductor wafer scribe streets, extending along the edges of each integrated circuit chip and comprising a continuous barrier wall, adjacent to each chip, and a sacrificial composite structure, substantially parallel to the wall, being a discontinuous barrier wall comprising metal rivets interconnecting electrically conductive layers in an alternating pattern, and further describes slots opened into the protective overcoat of the wafer, reaching from the surface of the overcoat to the surface-nearest electrically conductive layer of the composite structure.

According to the Griffith energy-balance concept for crack formation in brittle solids (first published in 1920), a change in the length of a nascent crack or notch cannot change the sum of all energies; in other words, the sum of surface energy and mechanical energy has to stay constant. This means for a crack extension that the surface energy may generally increase, but the mechanical energy has to decrease. The mechanical energy itself consists of the sum of the strain potential energy stored in the material and the potential energy of the outer applied loading system. This says, whenever any of these energies can assume a lower value, the freed energy can be invested in generating more surface for an expanding crack.

Applying the Griffith equilibrium requirement to semiconductor devices, whenever uniform stress is applied (for instance during operation or testing of the semiconductor device) so that it is larger than the failure stress, a nascent crack may propagate spontaneously and without limit—unless it is stopped or arrested The failure stress at the crack front, in turn, is proportional to the free surface energy per unit area and to Young's modulus (a material constant), and inverse proportional to the length of the starter crack or notch. Since dicing streets are well-known areas for the generation of microcracks, they are prime concerns for latent failures of the semiconductor device due to propagating cracks.

The present invention comprises sacrificial structures for arresting insulator cracks in semiconductor circuit chips and methods for fabricating reinforced insulators in semiconductor wafers. It has particular application to dicing multi-level metal semiconductor wafers into individual circuit chips. The invention permits the introduction of electrically advantageous, but mechanically brittle insulators into the production of large-area, high-speed integrated circuits without risking reliability degradation through propagating cracks initiated by the dicing process.

Based on the invention, the fabrication of more than one metallic sacrificial structure transforms the brittle insulator areas around each circuit chip, into reinforced composites with considerable toughness against fracture and propagation of nascent cracks. The main contribution to this toughness comes from the intrinsic adhesion energies of the components. The toughening is attributable to shielding processes, notably bridging, where the reinforcing phases are left intact as ligaments at the crack interface. Key to attaining effective toughening is the existence of suitably weak interfaces to allow debonding between the insulators and the reinforcing metal structures, and energy dissipation within the ensuing bridges at separation. Even without optimizing the shielding processes, large increases in peak stress and strain to failure have been observed, with the crack resistance energy per unit area increasing up to an order of magnitude.

If a crack were able to penetrate the first seal structure by breaking through a weak flaw, or due to rupturing of the metal seal structure, it would loose its energy in debonding due to the reinforced composite properties of the insulating area, and would be arrested by the next seal structure. With these structures, the brittle oxides can preserve, their stiffness, but the metal structures enhance toughness and energy absorption capacity (illustrated by A. G. Evans, "Perspective on the development of high-toughness ceramics", J. Amer. Ceram. Soc., vol. 73, p. 187, 1990). If no full-scale plastic zone develops about the crack tip, the shielding is predominantly associated with dissociation of plastic energy at the metal across the crack interface.

The present invention is related to high density ICs, especially those having high numbers of inputs/outputs, and also to low end, low cost devices. These ICs can be found in many semiconductor device families such as standard linear and logic products, digital signal processors, microprocessors digital and analog devices, high frequency and high power devices, and both large and small area chip categories. The present invention further meets the requirements for minimizing the sacrifice of semiconductor material for dicing. The package type can be plastic dual in-line packages (PDIPs), small outline ICs (SOICs), quad flat packs QFPs), thin QFPs (TQFPs), SSOPs, TSSOPs, TVSOPs, and other leadframe-based packages.

It is an object of the present invention to securely arrest any cracks originating from chip-outs caused by the rotating dicing blades, especially, in the surface near protective overcoat.

Another object of the present invention to provide reliability assurance for the finished product against mechanical stresses by introducing structural reinforcement of intermetal dielectrics, which also double as sealing barriers against migrating chemical impurities.

Another object of the present invention is to prevent delamination of dielectrics from copper metallization by designing the sacrificial structure in the scribe street as reinforcing rivets.

Another object of the present invention is to provide reliability assurance for the finished product by changing the failure mechanism from a probabilistic weakest-link mode to a parallel-type mode, effectively eliminating the failure mechanism. This built-in reliability assurance can be applied for several future generations of products.

Another object of the present invention is to apply electrical bias to at least some of the structures such as to arrest the drift of unwanted charged particles.

Another object of the present invention is to introduce a multitude of sacrificial structures such that they can be produced along with the integrated circuits without needing extra space or adding extra manufacturing cost.

These objects have been achieved by the design and mass production process of the sacrificial structures of the invention. Various modifications have been successfully employed for integrated circuits of different design rules and hierarchies of metal/insulator layer sequences.

In the first embodiment of the invention, metal-filled trenches are positioned on top of each other, forming a continuous "wall" of metal, which transects the layers of insulating films disposed on top of each other. Such metal wall, substantially parallel to the dicing lines, extends all around the periphery of the circuit chip and represents a sacrificial structure for protecting the chip circuitry.

For an insulator crack, originating at the dicing line and driven to propagate into the chip towards the integrated circuitry, a sacrificial structure consisting of metal rivets through the insulating layers and interconnecting electrically conductive layers in an alternating pattern, arrests further propagation by changing the failure mechanism from a probabilistic weakest link mode to a parallel-type mode.

In an additional embodiment of the invention, the sacrificial structure is in electrical contact with a highly doped region of the semiconductor wafer. Electrical potential, such as ground potential, can thus be applied to the sacrificial structure, effectively stopping the drift of unwanted charged particles.

In an additional embodiment of the invention, the sacrificial structures form a three-dimensional network of metal distributed in brittle oxides; the mesh size of this metal net is designed such that the adhesion between the metals and the brittle oxides is reinforced to avoid delamination.

In the second embodiment of the invention, a slot is opened into the protective overcoat, reaching from the overcoat surface at least to the surface-nearest electrically conductive layer of the composite sacrificial structure, and surrounding the periphery of the chip. This slot stops any crack, which propagates from the dicing line towards the circuitry approximately parallel to the overcoat surface.

The technical advances represented by the invention, as well as the objects thereof will become apparent from the following description of the preferred embodiments of the invention, when considered in conjunction with the accompanying drawings and the novel features set forth in the appended claims.

BRIEF DESCRIPTION OF THE DRAWINGS

FIG. 1B is a simplified and schematic planar view of a portion of the first embodiment of the invention. FIG. 1A is obtained along the section line A—A.

FIG. 2B is a simplified and schematic planar view of a portion of the first embodiment of the invention. FIG. 2A is obtained along the section line AA—AA.

DETAILED DESCRIPTION OF THE PREFERRED EMBODIMENTS

Figure 1A:
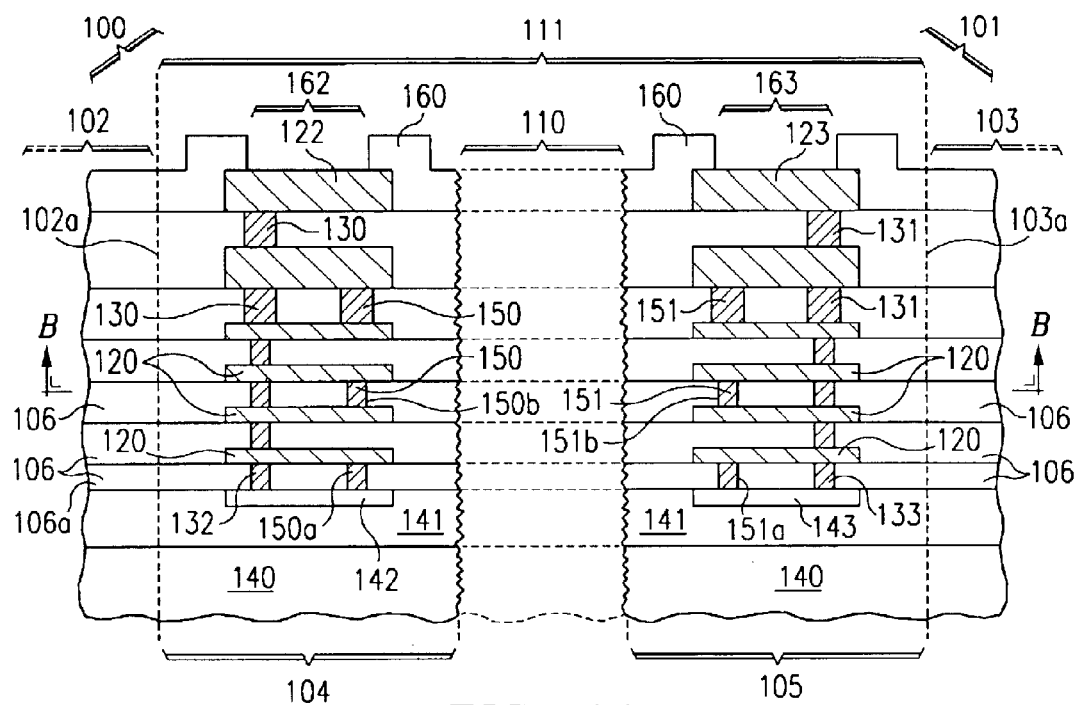
FIG. 1A is a simplified and schematic cross sectional view of portions of the first and the second embodiments of the invention.

The present invention is related to any integrated circuit (IC) chips, in the preferred embodiments to large IC chips containing high-speed integrated circuits. The electrical elements of the circuits are fabricated within the chosen semiconductor material, while a plurality of alternating metal layers and insulator layers stacked on top of the semiconductor surface serves as the network interconnecting the individual circuit components.

A plurality of chips is fabricated simultaneously on each large-diameter wafer of semiconductor substrate material; after completion of the fabrication process, they have to be separated from each other in a process or singulation step termed "dicing". Typically, rapidly rotating blades are used as saws for this dicing process, generating "dicing lines" in the process.

Commonly, blades are made of steel or titanium alloys with fine grain-size diamond dust at the cutting perimeter. Usually, these dicing streets cut completely through the thickness of the semiconductor wafer, and in the process generate a "longitudinal edge" on each side of each dicing cut. By the nature of the dicing operation, the two longitudinal edges generated by each dicing cut are parallel to each other. The semiconductor chips thus fabricated by the dicing process have a periphery of straight lines at right angles, forming rectangular or square shaped chip areas.

As defined herein, the term "dicing line" is used to refer to the opening produced by the rotating saw separating the individual chips. The term "scribe street" is used to refer to the width of semiconductor material between the individual active circuits; consequently, this distance includes a length of semiconductor material surrounding each circuit and remaining with each chip after the separating dicing process.

The semiconductor materials, usually silicon, gallium arsenide or other III–V compounds, are brittle. The insulators, especially those needed for high-speed integrated circuits, are typically selected from a group consisting of silicon dioxide, silicon nitride, oxy-nitride, fluoro-silicate glass, undoped silicate glass, phosphor-silicate glass, plasma-generated tetraethylortho-silicate oxide, and silicon-containing hydrogen silsesquioxane; all of them are brittle. Recently, gels, foamy substances, and organic polymerics such as polyimides, have also been employed. Often, these layers extend into and over the wafer areas, where the dicing will take place.

The brittle nature or multilayer structure of these materials makes it unavoidable that the rotating sawing blades leave ragged contours of microscopic chip-outs, or notches, on both sides of all dicing streets. Whenever it is energetically favorable, microcracks may initiate at these microscopically disturbed surfaces.

The present invention eliminates the propagation of nascent cracks, even in the extremely brittle insulators required for ultra-fast digital-signal processors (DSP) and microprocessors ($\mu$P). The present invention further meets the requirements for minimizing the sacrifice of semiconductor material for dicing. The invention also uses only processes already employed in IC manufacture, so that the use of the invention does not require extra cost expenses. The present invention can be incorporated into circuit chips of any size, even the largest dynamic random-access memories (DRAM), static random-access memories (SRAM), erasable programmable read-only memories (EPROM), and logic circuits (LOGIC).

FIG. 1A shows schematically a dicing line 110 (typically 40 to 60 $\mu$m wide) between the edges of two chips generally designated 100 and 101. The respective IC area terminates at the respective chip data edge; circuit 102 of chip 100 terminates at chip data edge 102a and is bordered by a length 104 of semiconductor material (typically 20 to 45 $\mu$m wide), topped by a sequence of stacked insulating layers 106. Circuit 103 of chip 101 terminates at chip data edge 103a and is bordered by a length 105 of semiconductor material, topped by a sequence of stacked insulating layers 107. The sum of these lengths 104 and 105 plus the dicing line 110 is the distance between adjacent chip data edges 102a and 103a, and represents the "scribe street" 111 between the circuits 102 and 103. Typical scribe streets are 80 to 150 $\mu$m wide. In the chip singulation process, the material in dicing line 110 is lost. Consequently, only the materials in lengths 104 and 105 remain with their respective circuits. For this region of each respective chip, the term "seal region" will be used herein. This region around the periphery of each chip contains the seal structures of the present invention intended for protecting the IC from propagating cracks and impurities.

Experience has shown that while a single seal structure in the seal region which surrounds the circuit area, may indeed stop some cracks originating from notches at the dicing street, it is by no means sufficient for stopping all cracks, in particular those developing in the more brittle insulator layers required today by the emerging ultra-fast integrated circuits. The reason is basically that cracks, when implied with enough energy, are able to migrate until they find the weakest link in the seal structure. The failure mechanism is, therefore, controlled by the probability that a nascent crack will find the weakest link. In addition, it has been experienced that migrating impurities are often not stopped by a single seal, so that mobile ions may diffuse right through.

The present invention avoids these difficulties by changing the failure mechanism from a probabilistic weakest-link mode to a parallel-type mode. Although the invention will be described in FIGS. 1A, 1B, 2A, 2B, 3A and 3B using a combination of scribe street seals and protective overcoat slots as particular embodiments, it should be understood by one skilled in the art that the principles of the present invention are applicable to different combinations. Furthermore, the integrated circuit wafer may be made of silicon, gallium arsenide, or any other semiconductor material customarily used in electronic device production.

FIG. 1A is a schematic cross section through a small portion of circuit chips 100 and 101 and the dicing line 110 between them. FIG. 1A also shows the cross sections through seal regions 104 and 105, with several embodiments of the invention positioned in each. The first embodiment comprises a seal structure made of a combination of a continuous wall and a discontinuous wall, interconnected by a plurality of patterned, electrically conductive layers 120. These layers are usually made of metal and are formed and patterned simultaneously with the equivalent metal levels of the ICs. As required by the specific IC design, the material of the electrically conductive layer is selected from a group consisting of copper, copper alloy, aluminum, aluminum alloy, tantalum, titanium, tungsten, molybdenum, chromium and compounds thereof.

The part of the seal structure closest to the chip data edge is the continuous barrier wall made by first etching trenches 130 and 131 through the thickness of the insulating layers 106, which are spaced between the electrically conductive layers. These trenches are aligned on top of each other. Next, the trenches are filled with electrically conductive material (usually metal, but not necessarily the same metal as used for the layers). The electrically conductive wall thus formed extends along the chip data edge.

As required by the specific IC design, the electrically insulating layers 106 are selected from a group consisting of silicon dioxide, silicon nitride, oxy-nitride, fluoro-silicate glass, undoped silicate glass, phosphor-silicate glass, plasma-generated tetraethylortho-silicate oxide, silicon-containing hydrogen silsesquioxane, gels, foamy substance, organic polymeric such as polyimide, and combinations thereof.

The trenches 132 and 133 closest to the semiconductor substrate may be in electrical contact with heavily doped regions 142 and 143, respectively, of the semiconductor substrate (sometimes referred to as the "moat"). The substrate itself often comprises a lowly doped epitaxial layer 141 on top of a more heavily doped starting material 140, both stretching uniformly across the whole wafer.

The other parts of the seal structure, between the chip data edge and the dicing line, are composite discontinuous barrier walls comprising metal columns 150 and 151, interconnecting the electrically conductive layers 120. These metal columns are called "rivets" herein since they not only interconnect the electrically conductive layers 120, but also strengthen the overall sacrificial scribe seal structures.

It is pivotal for the present invention, that these rivets 150 and 151 are arranged in an alternating pattern in order to provide the composite structure mechanical strength and prevent delamination, while simultaneously dispersing the energy associated with crack propagation. The alternating pattern of rivets 150 and 151 is best illustrated when different cuts through the seal structure are compared. In the cross section of FIG. 1A, the alternating reinforcing structure interconnects moats 142 and 143 with the first level of electrically conductive layers. The rivets are designated 150a and 151a, respectively. However, the cross section of FIG. 1A does not contain a rivet interconnecting the first and second conductive layers; it contains only the next rivets 150b and 151b interconnecting the second and third conductive layers.

Figure 1B:
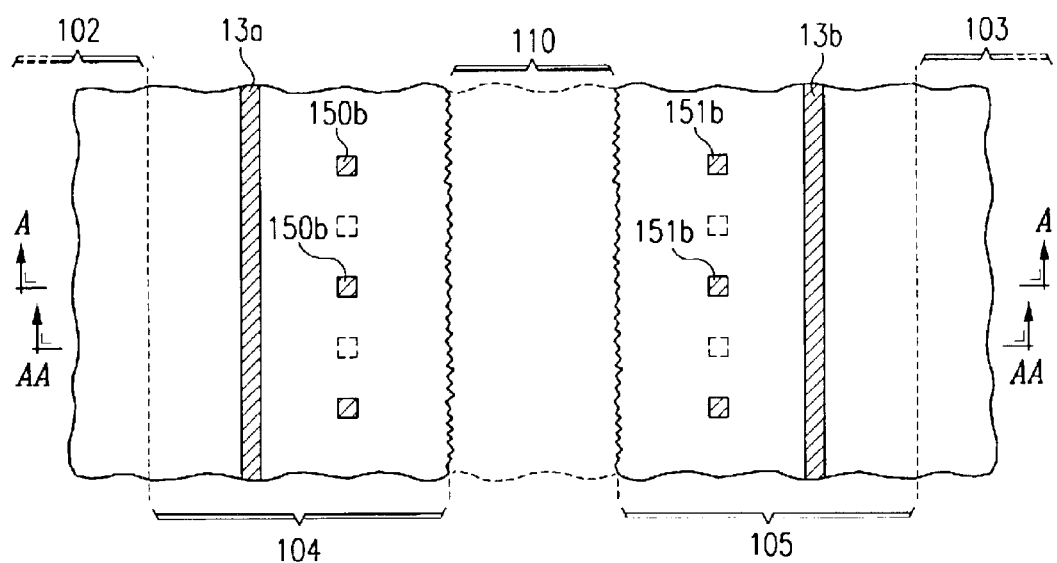
FIG. 1B is obtained along the section line B—B.

Taking a cut along line B—B at this rivet level results in FIG. 1B. The plurality of rivets is designated 150b and 151b. FIG. 1A has been obtained by a cross sectional cut along line A—A through one of the rivets 150b and 151b. FIG. 1B also shows the continuous design of the metal walls 13a and 13b, composed of the trenches 130 and 131, respectively, in FIG. 1A, which are parallel to the chip data edges 102a and 103a, respectively, and reach around the complete circumference of chips 100 and 101, respectively.

Repeating this pattern of alternating positions of rivets; the cross section of FIG. 1A shows a rivet interconnecting the fourth and fifth conductive layers, but no rivet interconnecting the third and fourth conductive layers and the fifth and sixth conductive layers. It will be obvious to persons skilled in the art that this alternating pattern can be extended to numbers of conductive layers higher or lower than the six layers illustrated in the preferred embodiment of FIGS. 1A and 1B.

Figure 2A:
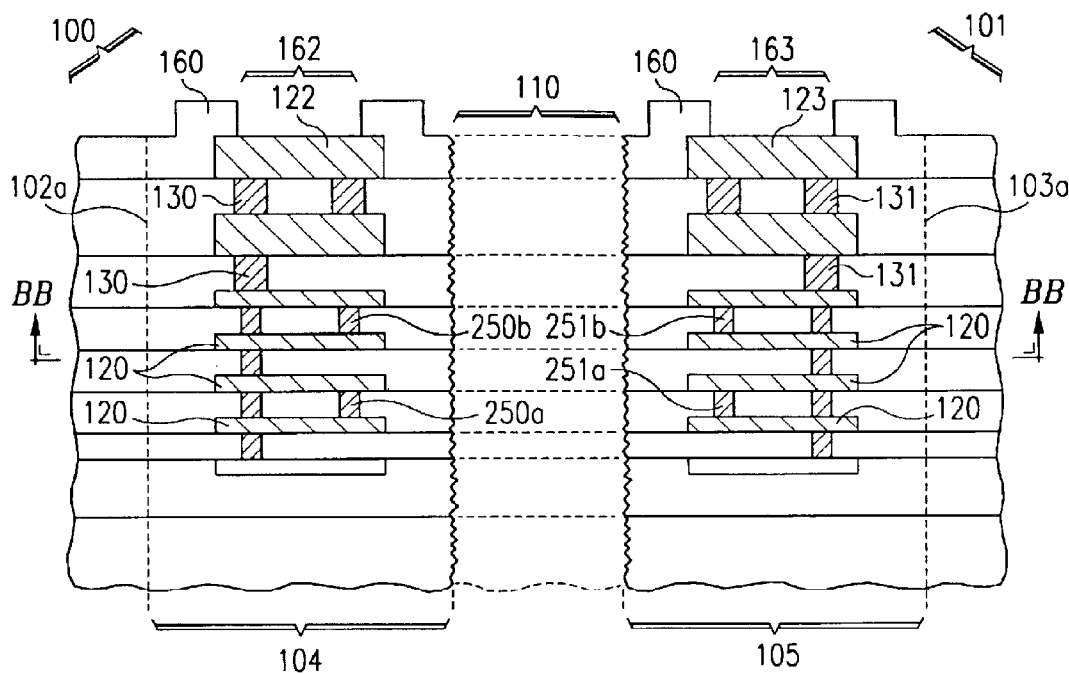
FIG. 2A is a simplified and schematic cross sectional view of portions of the first and the second embodiments of the invention.

All the metal rivets skipped in FIGS. 1A and 1B of the alternating pattern appear when the cross section is performed along line AA—AA in FIG. 1B. This cross section is illustrated in FIG. 2A. Metal rivets 250a and 251a interconnect the first and second conductive layers of the. plurality 120 of conductive layers. In repetitive design, rivets 250b and 251b interconnect the third and fourth conductive layers, and so on. The metal-filled trenches 130 and 131 are aligned to form the metal wall close to and surrounding chip data lines 102a and 103a, respectively, as in FIG. 1A.

Figure 2B:
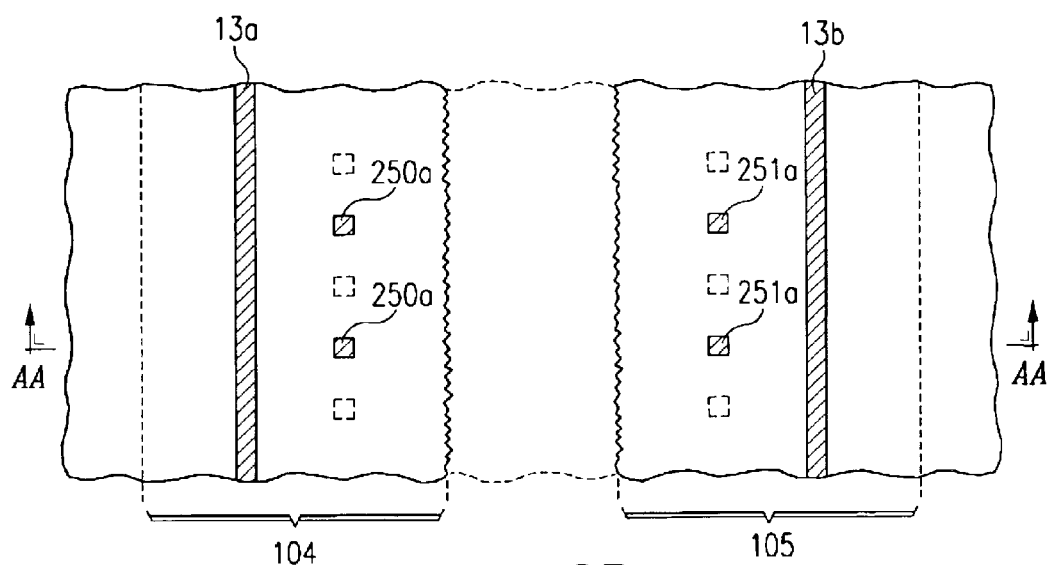
FIG. 2B is obtained along the section line BB—BB.

The cut along line BB—BB results in FIG. 2B, which indicates all the rivets locations skipped in FIG. 1B. Based on the cut, rivets 250a and 251a are highlighted. The continuous walls 13a and 13b are unchanged from FIG. 1B.

Figure 3A:
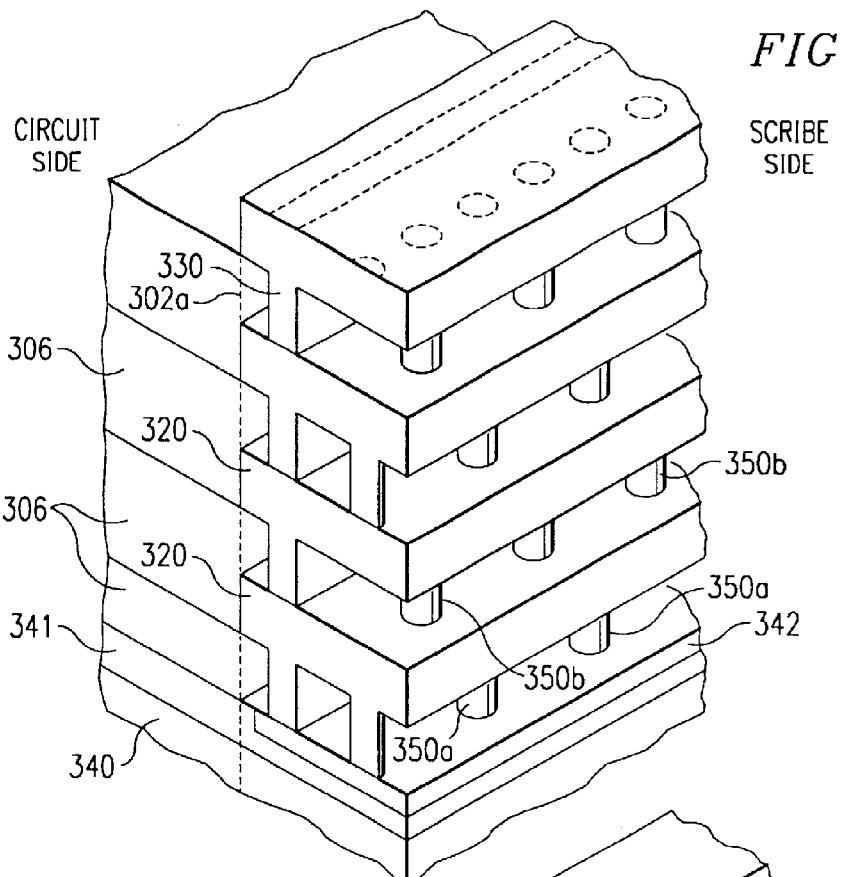
FIG. 3A is a simplified and schematic perspective view of a portion of the first embodiment of the invention.

FIG. 3A illustrates the alternating pattern of rivets in a schematic and simplified perspective view of a portion of a chip with circuit side and scribe side. Heavily doped starting material 340 and lowly doped epitaxial layer 341 (with diffused moat 342) of the wafer substrate have a hierarchy of insulating layers 306. Embedded are conductive layers 320; four levels are shown, but the structure may continue to higher level numbers. The aligned metal-filled trenches 330 form the metal wall structure close to the chip data edge 302a. As FIG. 3A shows, the position of the plurality of rivets 350a is alternating relative to the position of the plurality of rivets 350b. The rhythm of alternating positions is repeated throughout the hierarchy of insulating layers of the scribe seal portion of the chip.

Figure 3B:
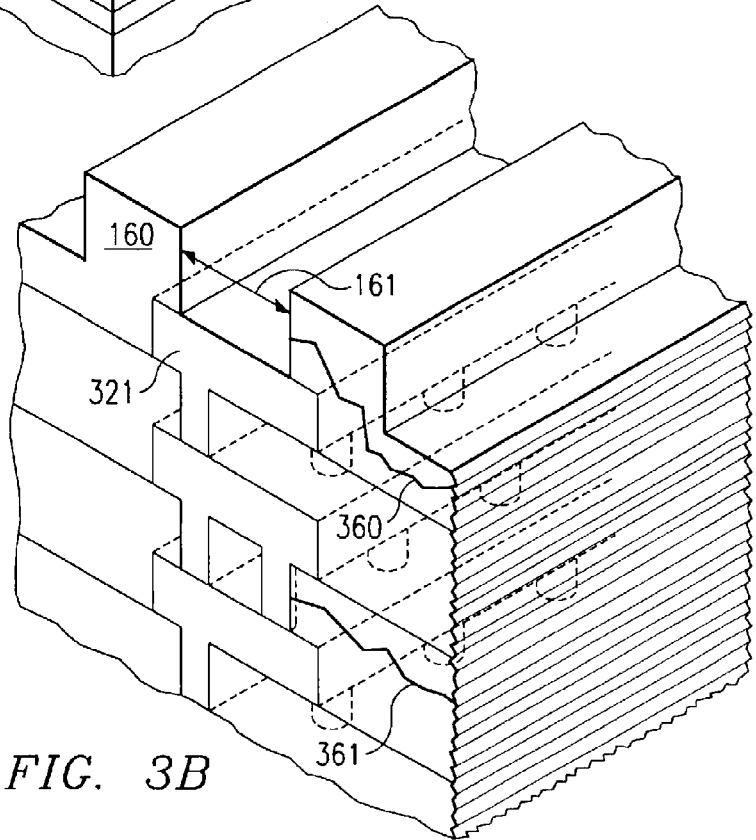
FIG. 3B is a simplified and schematic perspective view of a portion of the second embodiment of the invention.

FIGS. 1A, 2A and 3B also illustrate the second embodiment of the present invention, the slot opened in the protective overcoat and reaching from the surface of the overcoat at least to the surface-nearest electrically conductive layer of the sacrificial seal structure. The protective overcoat layer 160 is deposited over the whole wafer in a thickness usually between 0.5 and 1.0 μm. The preferred materialis moisture impermeable silicon nitride, silicon oxy-nitride, or combinations thereof. While the layer is free of pinholes, it is brittle, and cracks originating from dicing line 110 are able to propagate, approximately parallel to the surface, towards the circuit.

Consequently, the invention calls for slots (162 and 163 in FIGS. 1A and 2A, 161 in FIG. 3B) reaching from the surface of overcoat 160 through its whole thickness at least to the surface-nearest electrically conductive layer of the composite structures in the seal regions. In FIGS. 1A and 2A, these conductive layers are designated 122 and 123 in chips 100 and 101, respectively; in FIG. 3B, the conductive layer is designated 321. The width of the slot is not critical, but preferably less than 5 μm. In the fabrication process, the slots into the protective overcoat are opened simultaneously with the windows into the overcoat, which expose the circuit metal pads for attaching the bonding wires.

The seal structures are manufactured as a group step by step as sequential depositions of insulators and metals simultaneously with the fabrication of the integrated circuit components. First, a moat is diffused into the epitaxial semiconductor material in a process needed otherwise for fabricating strongly doped surface regions in some circuit elements (see FIGS. 1A and 2A). This low-resistance moat serves as an anchor for the seal structure to be built, and permits the application of specific electrical potentials to the seal structure, such as ground potential or Vss. It falls within the scope of the invention that either one, or more, or all, or none of the seal structures are anchored into respective moats. In another embodiment, all moats are coherent and fabricated by the same diffusion process.

Next, an insulating layer 106a is deposited over the whole wafer. As required by the specific IC design, the thickness of this layer typically is in the range of 0.8 to 1.0 μm. In FIGS. 1A and 2A, this includes the layer lengths 104 and 105 between the circuits and the dicing line 110.

Insulating layer 106a is patterned within each IC to form interconnect vias, while simultaneously openings 132, 133, 150a and 151a are plasma-etched through insulation layer 106a. Metal is then deposited (for instance, tungsten, copper, aluminum, or others) in order to form vertical component interconnections in the ICs, while simultaneously the seal structure openings are filled to form a portion of the seal structure.

Next, a layer 120 of metal (for example, aluminum or aluminum-copper alloy, or copper) is deposited and etched into a pattern so that it forms lateral interconnections in the ICs and simultaneously a lateral metal portion of the seal structure. As FIGS. 1A and 2A show, the thickness of metal layers 120 may vary from deposition process to deposition process. For instance, several layers may typically be in the thickness range between about 0.4 and 0.7 μm, while later depositions may have an increased thickness from about 0.8 to 1.2 μm. The width of the trenches for the continuous metal structure and the width of the columns for the discontinuous seal structure is typically in the range from about 0.2 to 0.4 μm in the earlier layers. These widths may gradually widen in successive layers for easier alignment and may finally be in the range from about 0.3 to 0.6 μm.

The sequence of these process steps is repeated several times with simultaneous processes performed for the circuits and the seal structures, as often as there are metal layer fabrication steps of the specific IC. In the example illustrated in FIGS. 1A and 2A, there are six metal layers 120 in each seal structure, and consequently also six aligned trenches 130 for the metal wall and six alternating and aligned columns for the discontinuous part in each seal structure. The width of each patterned metal layer may vary from layer to layer. Neither the trenches nor the columns have to be aligned exactly on top of each other; they may often have a slight offset alignment resulting in a stairstep configuration when viewed in cross section.

Finally, a protective overcoat layer 160, such as silicon nitride, is deposited over the whole wafer. The slot 162 is etched through it simultaneously with the openings of the bonding pads in the Ics.

Two cracks 360 and 361 are schematically indicated in the seal region of FIG. 3B, originating at dicing line notches and irregularly growing into the brittle insulator. The deposited oxides and glasses are generally very brittle. However, based on the invention, the fabrication of more than one metallic seal structure transforms these brittle insulator areas around each circuit chip into reinforced composites with considerable toughness against fracture and propagation of nascent cracks. From this protecting property, the name "sacrificial structure" has been derived. The slot in the protective overcoat stops cracks in the overcoat.

The sacrificial structures of the present invention may take a multitude of different shapes, as determined by circuit design rules and number and nature of process steps. Over and above their crack-stopping characteristic, they greatly reinforce the seal structures and prevent delamination in particular for metallizations using copper or copper alloy. In addition, it should be pointed out that the moat is not essential for the shielding and crack-stopping ability of the seal structure and the re-enforcing and toughening of the brittle oxides; the moat simply permits the application of electrical bias to the metal structure, such as ground potential and Vss. This property helps in stopping the drift of charged impurities such as unwanted ions.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, various refractory metals may be used for embedding the copper in copper metallizations in building the seal structures as well as the ICs. It is therefore intended that the appended claims encompass any such modifications or embodiments.

We claim:

1. A method for fabricating an array of integrated circuit chips in a semiconductor wafer, while simultaneously fabricating seal structures in scribe streets bordering said circuit chips, comprising the steps of:

depositing an electrically insulating layer onto said wafer to form an insulating portion of an active circuit component, while simultaneously forming an insulating portion of said seal structure;

patterning said insulating layer within each said integrated circuit to form interconnect vias, while simultaneously creating continuous and discontinuous openings through an insulating layer of said seal structure from one surface to the opposite surface;

depositing metal onto said insulating layer to form vertical component interconnections, while simultaneously filling said seal structure openings to form a portion of said seal structure;

patterning said metal layer within each said integrated circuit to form lateral interconnections, while simultaneously forming lateral metal portions of said seal structure;

repeating said simultaneous deposition and patterning steps of consecutive insulating and metal layers, until the circuit interconnections and said scribe street seals are completed.

2. The method according to claim 1 comprising the step of doping preselected regions of said wafer to create electrically conductive zones in each said integrated circuit, while simultaneously creating electrically conductive moats in said seal structures.

3. The method according to claim 1 further comprising the steps of:

depositing a layer of protective overcoat onto said wafer; and forming patterned openings through said overcoat, thereby creating windows for bonding wires to said circuits, while simultaneously creating slots for stopping cracks in said overcoat.

4. A method for forming integrated circuit chips in a wafer, comprising the steps of:

forming in said wafer an array of integrated circuit chips separated by scribe streets;

forming in each of said streets at least one continuous barrier wall adjacent each chip; and forming at least one sacrificial composite structure between said wall and the center of said street, said composite structure being a discontinuous barrier wall comprising metal rivets interconnecting electrically conductive layers in an alternating pattern.

5. The method of claim 4, further comprising the step of electrically coupling at least part of said composite structure to a highly doped region of said wafer.

6. The method of claim 4, wherein said step of forming a barrier wall comprises forming a metal barrier wall.

7. The method of claim 4, wherein said step of forming a composite structure comprises forming said electrically conductive layers of said structure of a metal selected from the group consisting of copper, copper alloy, aluminum, aluminum alloy, tantalum, titanium, tungsten, molybdenum, chromium, and compounds thereof.

8. A method for forming integrated circuit chips in a wafer, comprising the steps of:

forming in said wafer an array of integrated circuit chips separated by scribe streets;

forming in each of said streets at least one continuous barrier wall adjacent each chip;

forming at least one sacrificial composite structure between said wall and the center of said street, said composite structure being a discontinuous barrier wall comprising metal rivets interconnecting electrically conductive layers in an alternating pattern;

forming a protective overcoat over said wafer; and opening at least one slot in said protective overcoat, said slot reaching from the surface of the overcoat at least to the surface-nearest electrically conductive layer of said composite structure.

9. The method of claim 8, further comprising the step of electrically coupling at least part of said composite structure to a highly doped region of said wafer.

10. The method of claim 8, wherein said step of forming a barrier wall comprises forming a metal barrier wall.

11. The method of claim 8, wherein said step of forming a composite structure comprises forming said electrically conductive layers of said structure of a metal selected from the group consisting of copper, copper alloy, aluminum, aluminum alloy, tantalum, titanium, tungsten, molybdenum, chromium, and compounds thereof.

12. A method for forming integrated circuit chips in a wafer, comprising the steps of:

forming in said semiconductor wafer a plurality of integrated circuit chips spaced from one another by scribe streets, each of said scribe streets having two longitudinal edges and a central dicing line between said longitudinal edges; and during said step of forming said integrated circuit chips, forming at said longitudinal edges a composite structure comprising a plurality of patterned electrically conductive layers and a plurality of patterned electrically insulating layers.

13. The method of claim 12, further comprising the step of electrically coupling at least part of said composite structure to a highly doped region of said wafer.

14. The method of claim 12, further comprising the step of forming a barrier wall between said chips and said dicing line.

15. The method of claim 14, wherein said step of forming a barrier wall comprises forming a metal barrier wall.

16. The method of claim 12, wherein said step of forming a composite structure comprises forming said electrically conductive layers of said structure of a metal selected from the group consisting of copper, copper alloy, aluminum, aluminum alloy, tantalum, titanium, tungsten, molybdenum, chromium, and compounds thereof.

* * * * *